(12) United States Patent
Hartmann (10) Patent No.: US 10,550,320 B2
(45) Date of Patent: Feb. 4, 2020

(54) CONVERTER FOR LIGHTING DEVICES (71) Applicant: ZKW Group GmbH, Wieselburg (AT)

(72) Inventor: Peter Hartmann, Schoenbuhel-Aggsbach (AT)

(73) Assignee: ZKW GROUP GMBH, Wieselburg (AT)

( * ) Notice: Subject to any disclaimer, the term of this patent is extended or adjusted under 35 U.S.C. 154(b) by 135 days.

(21) Appl. No.: 15/770,566

(22) PCT Filed: Oct. 28, 2016

(86) PCT No.: PCT/AT2016/060092
§ 371 (c)(1),
(2) Date: Apr. 24, 2018

(87) PCT Pub. No.: WO2017/079773
PCT Pub. Date: May 18, 2017

(65) Prior Publication Data
US 2019/0316033 A1 Oct. 17, 2019

(30) Foreign Application Priority Data

Nov. 11, 2015 (AT) .................................. 50964/2015

(51) Int. Cl.
*B32B 3/00* (2006.01)
*C09K 11/02* (2006.01)
(Continued)

(52) U.S. Cl.
CPC .............. *C09K 11/02* (2013.01); *C01B 32/26* (2017.08); *C09K 11/08* (2013.01); *F21S 41/16* (2018.01);
(Continued)

(58) Field of Classification Search
CPC .......... C09K 11/02; C09K 11/08; F21S 41/16; F21S 41/176; F21S 43/176; C32C 16/27
See application file for complete search history.

(56) References Cited

U.S. PATENT DOCUMENTS 7,675,079 B1 3/2010 Kley
9,890,918 B2 2/2018 Singer et al.
(Continued)

FOREIGN PATENT DOCUMENTS

DE 102008027339 A1 11/2009
DE 102013102205 A1 9/2014
(Continued)

OTHER PUBLICATIONS

International Search Report and Witten Opinion for PCT/AT2016/060092, dated Feb. 13, 2017 (11 pages).
(Continued)

*Primary Examiner* — Elizabeth E Mulvaney
(74) *Attorney, Agent, or Firm* — Eversheds Sutherland (US) LLP (57) ABSTRACT

The invention relates to a converter (25, 35, 45, 55, 65, 75, 85, 95, 115, 125) for a lighting device, in particular for a lighting device for a motor vehicle headlight, wherein the converter comprises a converter material (24, 34, 44, 54, 64, 74, 84, 94, 114, 124) for at least partly converting a primary light, which is emitted from a primary light source, into a secondary light, wherein the secondary light has a different wavelength than the primary light, wherein the converter comprises a flat diamond support structure (20, 30, 40, 50, 60, 70, 80, 90, 110, 120) made of polycrystalline diamond with a plurality of column-shaped diamond crystals (23, 33, 43, 53, 63, 73, 83, 93, 113, 123), which form a column-shaped diamond texture, wherein regions (22, 32, 42, 52, 62, 72, 82, 92, 112, 122) of the diamond support structure comprise the converter material (24, 34, 44, 54, 64, 74, 84,
(Continued)

94, 114, 124), and free spaces remain between said regions, the free spaces allow the primary light to pass through the diamond support structure without being converted.

35 Claims, 7 Drawing Sheets

(51) Int. Cl.
  *C01B 32/26* (2017.01)
  *F21S 41/176* (2018.01)
  *F21S 41/16* (2018.01)
  *F21S 43/16* (2018.01)
  *C09K 11/08* (2006.01)
  *C23C 16/27* (2006.01)

(52) U.S. Cl.
  CPC ............ *F21S 41/176* (2018.01); *F21S 43/16* (2018.01); *C23C 16/27* (2013.01)

(56) References Cited

U.S. PATENT DOCUMENTS

| | | |
|---|---|---|
| 2011/0249460 A1 | 10/2011 | Kushimoto |
| 2014/0072812 A1 | 3/2014 | Hamada et al. |
| 2014/0084325 A1 | 3/2014 | Yamanaka et al. |
| 2015/0102732 A1 | 4/2015 | Engelen et al. |
| 2016/0146434 A1 | 5/2016 | Mönch et al. |

FOREIGN PATENT DOCUMENTS

| | | |
|---|---|---|
| EP | 1536043 A1 | 6/2005 |
| EP | 2063170 A2 | 5/2009 |
| WO | 2009/115976 A1 | 9/2009 |
| WO | 2013/144053 A1 | 10/2013 |

OTHER PUBLICATIONS

Office Action issued in Austrian Application No. 50964/2015, dated Oct. 24, 2016 (2 pages).

CONVERTER FOR LIGHTING DEVICES

The invention relates to a converter for a lighting device, in particular for a lighting device for a motor vehicle headlight, wherein the converter comprises a converter material for at least partly converting a primary light, which is emitted from a primary light source, into a secondary light, wherein the secondary light has a different wavelength than the primary light.

The invention also relates to lighting devices and motor vehicle headlights and signal lamps comprising a converter according to the invention. The invention additionally relates to methods for producing the converter according to the invention.

The use of laser light sources in motor vehicles is currently gaining in importance, since in particular laser diodes enable versatile and more efficient solutions, whereby the light beam and the light intensity of the light yield can also be significantly increased.

In the known solutions, however, no direct laser beam is emitted, so as to avoid an endangerment to humans and other living beings, in particular eyes, by the extremely bundled high-power light beam. Rather, the laser beam is conducted onto an intermediate converter containing a luminescence converter material, referred to as a "phosphor" for short, and is converted for example from blue light into preferably "white" light, in particular such that a legally compliant white light impression in superimposition with the scattered laser radiation results.

In conjunction with the present invention the term "converter material" or "phosphor" is understood quite generally to mean a substance or a substance mixture which converts light of one wavelength into light of another wavelength or a wavelength mixture, in particular into "white" light, which can be subsumed under the term "wavelength conversion". Here, the term "white light" is understood to mean light of a spectral composition of this kind which is perceived as a "white" colour by humans. The term "light" is of course not limited to radiation visible to the human eye.

Optoceramics, which are transparent ceramics, such as YAG-Ce (an yttrium-aluminium garnet doped with cerium), have been known as converter material.

Light converters, in particular for lighting devices for motor vehicle headlights, have long been known from the prior art.

Known light converters are often constructed from a layer structure comprising a carrier (usually sapphire) and a converter material layer.

Document WO 2015004005 A1 discloses a conversion element with a separation structure and a plurality of conversion regions, wherein each conversion region is at least partially surrounded by part of the separation structure, and wherein each conversion region is designed to convert electromagnetic primary radiation at least in part into a secondary radiation of a greater wavelength. The conversion element can be paired with an LED array, for example.

Document US 2015/01027322 A1 describes a conversion element that is produced by screen printing and consists of regularly arranged fluorescent regions, the gaps between which are filled with a flexible gel or fluid. The flexible gel is used to compensate for thermomechanical stresses under temperature load.

Document EP 2 063 170 A2 discloses a lighting device for a vehicle comprising at least one light source and at least one optical imaging element arranged in the beam path of the light source, wherein a surface element is arranged between the light source and the imaging element, which surface element is designed at least to light up the focal plane of the imaging element. The surface element can be, inter alia, a light converter with delimited surface segments.

Document US 2011/0249460 A1 discloses a projection system with a light source, a "phosphor" element, and a projection lens.

Document DE 10 2013 102 205A1 describes a lighting device for a motor vehicle, with at least one laser radiation source, which excites at least one luminescent layer applied to a carrier device to emit light with a wavelength conversion. The luminescent layer is divided into individual pixels.

Document WO 2014/095906 A2 discloses a headlight device with a laser light source for emitting collimated primary radiation, a conversion element with conversion regions which are provided for at least partial conversion of the collimated primary radiation into secondary radiation and form luminous regions during operation, and separating webs, which separate the conversion regions from one another and are non-transmissive to the primary radiation and secondary radiation.

Document DE 10 2008 027 339 A1 describes a wavelength converter with heat-conducting components and a luminescent material which is used to at least partly convert an electromagnetic primary radiation into a secondary radiation of different wavelength. The heat-conducting component is arranged in an area provided for radiation transmission and can be embodied in the form of a lattice or a layer. The heat-conducting component can be a metal alloy, an inter-metal compound, sapphire, aluminium nitride, boron nitride, or diamond.

Document U.S. Pat. No. 7,675,079 B1 discloses a full-area intermediate layer formed of diamond between a light conversion region and an SiC light-emitting diode. The diamond layer enables an even adaptation of the refraction index from high values of the SiC diode to the lower values of the light conversion region. More UV light can thus enter the light conversion region without reflection at the boundary surface. The diamond layer is unstructured over its entire area and for example is deposited from the gas phase by means of chemical deposition (chemical vapour deposition, or CVD).

One problem with known light converters lies in the fact that, when converting an intense, focussed laser beam, as is used for example for scanning headlights, there are limitations with regard to the thermal management, for example such as the scattering and optimisation of the heat flows in the headlight, and with regard to the attainable fine resolution or the contrast behaviour of a converted light spot.

The object of the invention is to provide a converter, in particular a laser light converter, which on the one hand enables an optimised dissipation of heat at specific points and on the other hand enables an optimised lateral distribution of the converter material with regard to structuring (discrete pixilation) and scatter effect and thus enables an adjustable resolution or contrast effect.

The object is achieved with a converter for a lighting device as described in the introduction in that the converter in accordance with the invention comprises a flat diamond support structure made of polycrystalline diamond with a plurality of column-shaped diamond crystals, which form a column-shaped diamond texture, wherein regions of the diamond support structure comprise the converter material, and free spaces remain between said regions and allow the primary light to pass through the diamond support structure without being converted.

The invention is consequently based on the use of a flat diamond support structure made of polycrystalline diamond as a cooling and light-spot-forming support unit for light converters. Due to the high thermal conductivity (1600 to >2000 W/mK), the high transparency and the very high refraction index (2.417), diamond is an optimum carrier medium for the converter material. Polycrystalline diamond on the one hand constitutes a potent heat sink with quick heat dissipation at specific points. On the other hand, on account of the texturing and topography of the diamond support structure, it is possible to apply the converter material with a selective structure (distribution, layer thickness, grain size), wherein the paths for the blue component of the secondary light can be kept free and the converter material filling, on account of the fragmentation, is relieved in respect of the load sustained as a result of changes in temperature. The converter according to the invention, due to the diamond structure, is permeable at least in regions to the primary light on account of the free spaces, such that the primary light is transmitted without conversion. Emitted secondary light is thus mixed with transmitted primary light.

The term "topography" is to be understood to mean the geometric properties (geometry, structure, height profile) of the surfaces of the flat diamond support structure, wherein the topography of polycrystalline diamond support structures comprises gaps/valleys and elevations, as is known per se. The flat diamond support structure consequently has an inner face and an outer face, wherein both the inner face and the outer face typically have topographical structures on account of the polycrystalline column-shaped diamond structure. During the course of crystal growth (see FIG. 3 and description in this regard further below) individual column-shaped diamond crystals grow together and form a substantially closed layer, which is ideally penetrated only by unavoidable gaps during the course of crystal growth.

The term "inner face" of the diamond support structure (or of the converter) is the face facing the substrate during the production of the polycrystalline diamond support structure by growth on a substrate. Accordingly, the "outer face" of the diamond support structure (or of the converter) is to be understood to mean the face facing away from the substrate during the production of the diamond support structure.

The regions of the diamond support structure comprising the converter material advantageously follow the topography of the flat diamond support structure. The converter material is thus applied to the diamond support structure with a selective structure (distribution, layer thickness, grain size), and this structure of the converter material is predefined by the diamond support topography. In this way, a similar distribution of the converter material regions and the free spaces that enable conversion-free passage of the primary light through the diamond support structure is achieved.

The converter according to the invention is particularly suitable for the conversion of blue laser radiation into a multi-spectral, approximately white light in motor vehicle headlight applications.

The column-shaped diamond crystals are oriented in the flat diamond support structure substantially in the direction of light propagation. In other words, the column-shaped diamond crystals are arranged substantially parallel to one another in the flat diamond support structure. This also includes epitaxial layers, in which the crystal columns are additionally oriented identically parallel to the substrate in that the lattice structure of the substrate determines the lattice structure of the crystal columns beyond seeding.

The diamond support structure is advantageously produced by chemical vapour deposition (CND). Methods for producing polycrystalline diamond layers by chemical vapour deposition have long been known. The crystal growth, faceting, and the surface morphology can be regulated, as is known per se, by controlling the rate of growth of the individual facets via process parameters (for example temperature, hydrocarbon:hydrogen ratio), the choice of the substrate, and the seeding conditions (for example see Hartmann P., 1997, Dissertation TU Wien University: Diamantabscheidung mit der DC-Glimmentladungsmethode sowie mit Borund Stickstoff-Zugabe im Hot-Filament-Verfahren ("Diamond deposition with the DC glow discharge method and with addition of boron and nitrogen in the hot-filament method); Wild et al., 1993, Diamond and Related Materials 2:158-168).

At the start of CVD deposition, isolated diamond crystals form on the substrate, leaving gaps free, which during the further course grow together to form a cohesive layer of individual crystals separated by grain boundaries. With continued crystal growth, a monocrystalline region with separated short defects forms upwardly, or the growth is stopped by facets with an orientation deviating from the substrate orientation, so as to leave behind (topographical) elevations and indentations on the outer surface of the column-shaped diamond structure.

Both the seed conditions and the preferred process parameters for the individual phases of crystal growth can be adjusted and controlled during the chemical vapour deposition.

The size of the crystallites is determined for example by the distance of the seeds on the substrate, which behaves reciprocally to seed density when at the same time the reaction partners in question have sufficient free path lengths, which can be influenced by the substrate temperature.

Deep gaps on the inner side remain particularly when the growth perpendicular to the substrate surface occurs much more quickly than the growth parallel to the substrate surface (growth in breadth).

Lastly, preferred facets can be enlarged selectively by promoting growth precisely in the direction of the competing facets.

Examples of column-shaped diamond textures and converters according to the invention and also the crystal growth are described in detail further below and in the accompanying drawings.

The column-shaped diamond crystals preferably have a mean width (mean crystallite width) of from 1 to 500 μm, preferably a width of from 20 to 100 μm. At these sizes, pixels are formed during the light conversion. Smaller mean widths are less preferred due to the extent of the currently used laser spots, but could also be used expediently with appropriate development of the lasers. Conversely, larger widths reduce the statistical mixture of primary light and scattered secondary light passing through, on account of the (limited) excitation area of the laser spot.

In advantageous embodiments, gaps in the flat diamond support structure are filled at least in part with the converter material. The term "filled" means that the converter material fills the gap partially or wholly or is applied as a layer to the gap surfaces.

The term "gap" relates in particular to valleys in the surface topography of the flat diamond support structure.

Furthermore, in specific embodiments, closed gaps filled with converter material can be produced in the diamond support structure by means of selective diamond growth and alternating deposition of polycrystalline diamond and converter material. For example, open gaps or valleys in the diamond support structure can be filled with the converter material, and the converter material can be enclosed by continuing the CVD diamond deposition in the diamond support structure.

In other variants described in detail further below, the converter material can firstly be applied in a structured manner to a substrate, and the diamond columns can then be grown in the regions between the converter material structures and subsequently grow together to form a polycrystalline flat column-shaped diamond texture.

For headlight applications, it is advantageous if the gaps filled with converter material (i.e. the layer thickness of the converter material) have a thickness of from 10 µm to 2 mm, preferably a thickness of from 100 to 500 µm).

The flat diamond support structure has an interface and an outer face, which have topographical structures, as described above. In certain embodiments, the gaps/valleys on at least one of the two faces of the diamond support structure are filled at least in part with converter material.

At least the gaps/valleys on the inner face of the diamond support structure are preferably filled at least in part with converter material. The interface is therefore the preferred side, because here the gaps/valleys are deeper on account of the crystal growth and allow a greater thickness of the filling converter material. In order to be able to fill the gaps on the inner face of the diamond support structure with converter material, the diamond support structure must be detached from the substrate (or the substrate detached from the diamond support structure), as described further below.

In further embodiments, the gaps/valleys on both faces of the flat diamond support structure can be filled at least in part with converter material.

The flat diamond support structure has an inner face and an outer face, which have topographical structures as described above. In other embodiments, the converter material is applied at least in part to elevations on at least one of the two faces of the diamond support structure.

In certain sub-variants, the converter material is applied at least in part to elevations on the outer side of the diamond support structure.

The converter material is preferably selected from the group consisting of Cer-doped yttrium aluminium garnet (YAG-Ce), lanthanum-doped yttrium oxide ($Y_2O_3$—$La_2O_3$), magnesium aluminium spinel ($MgAl_2O_4$) and europium-doped $M_2Si_5N_8$ with M=Ca, Sr or Ba.

A further subject of the invention relates to a lighting device for a motor vehicle headlight or a signal light, comprising a primary light source and a converter (light converter) according to the invention as disclosed herein. The primary light source, for headlight applications, is advantageously a laser light source, preferably a laser light source emitting blue light.

A further subject of the invention also relates to a motor vehicle headlight or a signal light comprising a converter according to the invention or a lighting device according to the invention as disclosed herein. The term "motor-vehicle headlight" or "headlight" includes all kinds of motor vehicle headlights, in particular front headlights, and the term "signal lights" includes all kinds of signal lights, including tail lights.

The invention also relates to a first advantageous method for producing a converter according to the invention or a lighting device as described herein, characterised by the following steps:

a) producing a flat polycrystalline diamond support structure on a flat substrate by means of chemical vapour deposition (CVD), b) at least partially applying converter material in regions of the diamond support structure, wherein free spaces remain between the regions having the converter material, and the free spaces allow the primary light to pass through the diamond support structure without being converted, and optionally detaching the flat substrate from the polycrystalline diamond support structure after step a) or after step b).

The production of polycrystalline CVD diamond structures is known per se and is described in detail in the literature (for example see Hartmann P., 1997, Dissertation TU Wien University: Diamantabscheidung mit der DC-Glimmentladungsmethode sowie mit Bor- und Stickstoff-Zugabe im. Hot-Filament-Verfahren ("Diamond deposition with the DC glow discharge method and with addition of boron and nitrogen in the hot-filament method); Wild et al., 1993, Diamond and Related Materials 2:158-168). For the reaction, atomic hydrogen and activated hydrocarbon must be made available, and this is achieved for example by thermal disassociation, glow discharge, or plasma, which is excited by microwaves. Methane and/or acetylene are used in routine practice as carbon sources. Polycrystalline diamond structures are typically created at temperatures between approximately 750 to approximately 950° C., with a high level of atomic hydrogen and a low level of carbon. The temperature of the substrate of more than 750° C. ensures a sufficient average free path length of the reaction partners on the substrate, such that crystallites of suitable size are produced; below this temperature, a very fine grain size, and ultimately graphite, is attained. The cleaving of hydrogen from the surface of the crystallites is additionally made possible in the temperature range of from approximately 750° C. to approximately 950° C., whereby the reaction at the surface is maintained.

The regions having the converter material are selected from the group consisting of gaps (valleys, closed gaps as described above) and elevations of the diamond support structure.

In order to be able to fill the polycrystalline diamond support structure obtained in step a) also from the inner face (i.e. from the side facing the substrate), the diamond support structure and the substrate have to be separated from one another. The methods differ depending on the substrate. In the case of permanent adhesion (for example chemical bonding), the substrate must be removed by etching; silicon as substrate for example can be dissolved in an oxidising manner in a hydrofluoric acid-nitric acid mixture. In the case of a molybdenum substrate, the diamond support structure is only weakly bonded and detaches from the molybdenum substrate surface during cooling on account of the different coefficients of thermal expansion.

In certain embodiments the diamond support structure can be processed prior to the application of the converter material by a focussed ion beam (FIB) method, by laser drilling, by oxidative etching (for example by applying a metal layer to individual crystal grains and subsequent oxidative etching back of the regions between the metal-coated grains), by applying a hot metal powder (for example powdered Cer or Fe), by polishing, or by stamping (for example with a hot iron tool). Here, stamping is not understood to mean material displacement, but instead detachment of carbon from the diamond structure in the metal stamping tool. In this way, further structures can be introduced into the diamond support structure, or structures such as column-shaped diamond crystal tips can be removed.

In a development of the method a (metal, oxide, carbide, nitride) adhesive layer can be applied to the diamond support structure, at least in regions prior to the application of the converter material, in order to improve the adhesion of the converter material to the diamond support structure.

The converter material can be applied to the diamond support structure by a reaction in situ, for example by chemical deposition of gaseous reactants. This has the advantage that the process can be performed in the same reactor as that for producing the diamond support structure. The converter material can also be applied by (physical) material deposition/condensation on the diamond support structure, wherein the converter material is transferred from a material source to the diamond support structure without changing the composition, for example by sputtering or spray coating.

Alternatively, the converter material can be applied in a solid, liquid or gel-like preform and can be converted in a subsequent reaction, for example controlled by a temperature profile, into a solid phase connected to the diamond support structure. It is advantageous here that the temperature necessary for this purpose is lower than in the case of chemical deposition, such that the diamond support structure is not attacked, not even under oxidising conditions, for example. For example, sol-gel methods fall under methods of this kind, under the individual method steps of application by means of a doctor knife and sintering.

The application of the converter material can additionally be locally controlled by masking/etching of preferably metallic or photopolymer auxiliary layers.

A further advantageous method for producing a converter according to the invention for a lighting device as described herein is characterised by the following steps:

a) producing a structured converter material layer on a flat substrate,
b) depositing a flat polycrystalline diamond support structure on the substrate having the structured converter material layer by means of chemical vapour deposition (CVD), and optionally detaching the flat substrate from the polycrystalline diamond support structure having the converter material after step b).

In this method, the converter material is thus firstly applied in a structured manner to a substrate, and the diamond columns are then grown in the regions between the converter material structures and subsequently grow together to form a polycrystalline flat column-shaped diamond texture. The polycrystalline diamond support structure filled with converter material can then be separated from the substrate, if desired. The polycrystalline CVD diamond structures are produced as described above in conjunction with the first method. In this method, the converter material can be deposited chemically by means of chemical vapour deposition (CVD) or physically by material deposition/condensation (physical vapour deposition or PVD) onto auxiliary layers, for example lacquer, that can be structured by photolithography, or can be structured by photolithography following deposition over the entire area. In other methods, solid or gel-like preforms can be applied in a structured manner, for example printed on in a structured manner, for example by being printed by masking. The subsequent conversion of the preform into the converter material can be controlled in turn by a temperature profile, however the temperature budget of the following diamond structure production (step b) above), specifically the temperature thereof over the given process time, could preferably also be used.

In a variant of the above-described method according to the invention, the chemical vapour deposition of the diamond support structure is based on a selective seeding of the diamond crystals on the substrate, wherein the substrate or the substrate surface is produced from a foreign material. The term "foreign material" is to be understood to mean a material that does not consist of diamond. The substrate is preferably selected from the group consisting of silicon, an element from the group of refractory metals (Ti, Zr, Hf, Va, Nb, Ta, Cr, Mo and W) in particular molybdenum, silicon carbides, carbides of an element from the group of refractory metals (Ti, Zr, Hf, Va, Nb, Ta, Cr, Mo and W), silicon with carbidised surface, and an element from the group of refractory metals (Ti, Zr, Hf, Va, Nb, Ta, Cr, Mo and W) with carbidised surface. On foreign material the crystal growth starts at the seed points.

In a further variant of the method according to the invention, the chemical vapour deposition in step a) is performed on the basis of a homoepitaxial process. Here a diamond substrate which in particular is selected from HPHT diamond (for example Sumicrystal™ from Sumimoto Electric USA or diamond substrates from Element Six) and preferably polished natural or CVD diamond substrates can be used as substrate. In the case of a diamond substrate the entire available surface is used as seed surface. In regions that are to be kept free from gaps for the converter material, the surface is covered with structured materials. For example, metals such as Cu, Au or Ag, which have a low solubility for carbon and do not form carbides, can be used as materials for this purpose. The materials for example can be applied firstly to the entire substrate surface and can be structured by means of photolithography to produce seed-free islands. Alternatively, instead of a structure material, the converter material can be applied as a structured layer, prior to the deposition of the diamond support layer on the diamond substrate (see the description above in conjunction with the alternative methods).

The converter material is advantageously selected from the group consisting of Cer-doped YAG (yttrium aluminium garnet, lanthanum-doped yttrium oxide ($Y_2O_3$—$La_2O_3$), magnesium aluminium spinel ($MgAl_2O_4$) and europium-doped $M_2Si_5N_8$ with M=Ca, Sr or Ba.

The invention will be described in greater detail hereinafter on the basis of non-limiting examples and the accompanying drawings.

Figure 1:
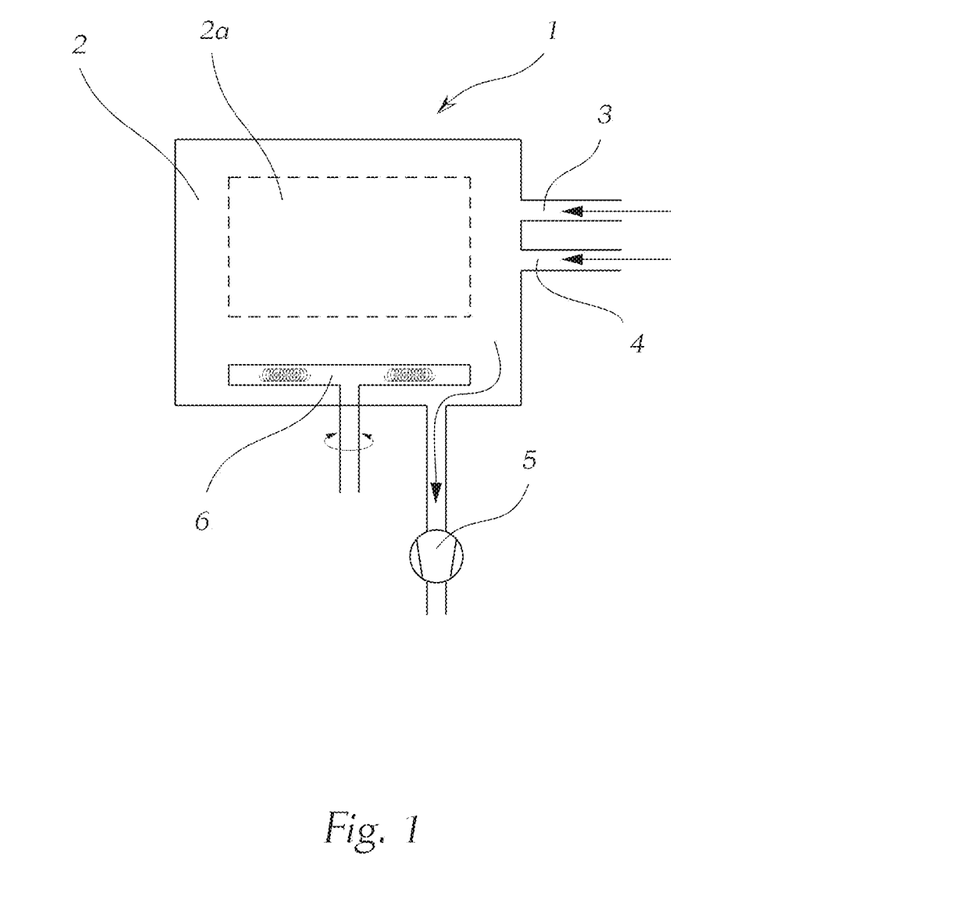
FIG. 1 shows an example of the structure of a reactor 1 for the chemical vapour deposition (CVD reactor) that can be used to produce a light converter according to the invention.

FIG. 1 shows an example of a widespread CVD reactor 1 which can be used for the production of a flat diamond support structure for a light converter according to the invention. The CVD reactor 1 has an interior 2, which can be evacuated by means of a pump 5 in order to produce a vacuum (basal pressure<1 mbar, low $N_2$ partial pressure; process pressure between 1 mbar and 1 bar (depending on target deposition rate, performance, gas flow), wherein highpurity process gases are preferably used). The CVD reactor 1 has gas inlets 3, 4 into the interior 2, via which process gases such as molecular hydrogen or gaseous hydrocarbon compounds and/or carrier gases are introduced into the interior 2. For reactive deposition, atomic hydrogen and activated hydrocarbon must be made available in a region of the interior 2, i.e. the reaction chamber 2*a*, and this is achieved for example by thermal dissociation, glow discharge, or plasma, which is excited by microwaves. Methane and acetylene are often used in routine practice as carbon sources. The reactor 1 also has a support surface 6 for substrates, onto which the flat diamond support structure and in certain applications also the converter material are deposited by means of CVD.

Figure 2:
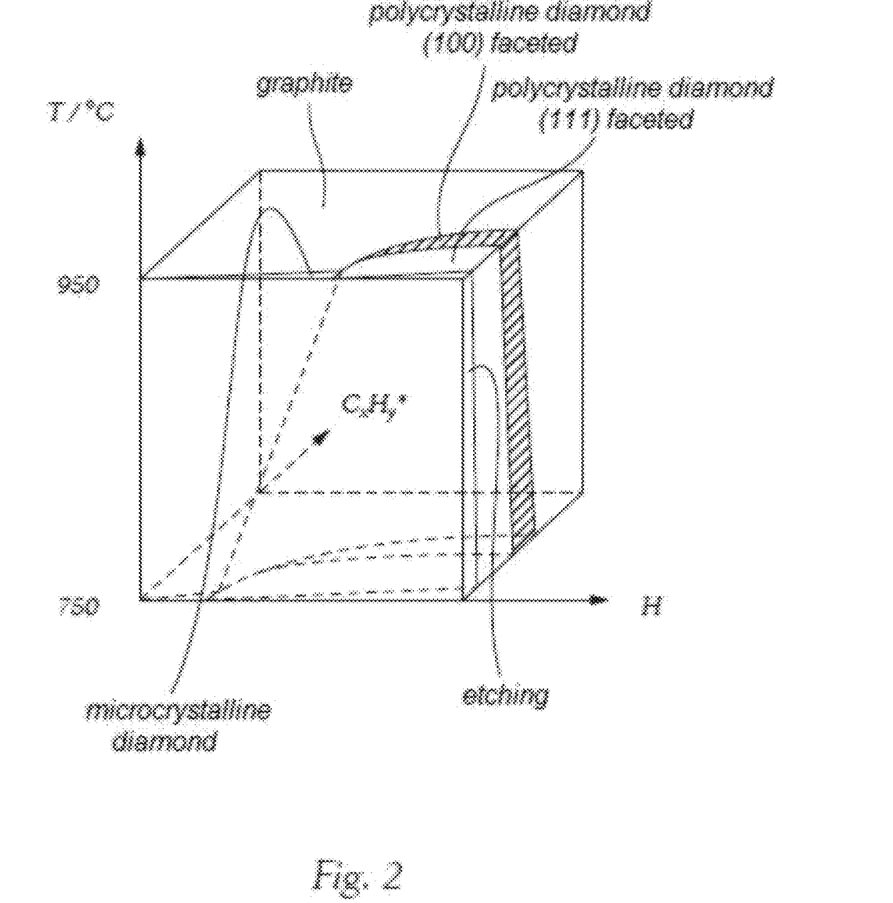
FIG. 2 shows a carbon phase graph, which shows the influence of the most important growth parameters on the crystal morphology of diamond.

FIG. 2 shows a carbon phase graph showing the influence of the most important growth parameters on crystal morphology (taken, albeit modified, from L. Vandenbulcke et al. $7^{th}$ Euro-CVD Conference, Perpignan, France, 19-23 Jun. 1989). As can be seen from the phase graph, polycrystalline diamond structures ((100) faceted and (111) faceted) are produced at temperatures between approximately 750 to approximately 950° C., with a high level of atomic hydrogen (H) and a low level of activated hydrocarbon compounds ($C_xH_y$* such as methane $CH_4$, or acetylene $C_2H_2$). The temperature of the substrate of more than 750° C. ensures a sufficient average free path length of the reaction partners on the substrate, such that crystallites of suitable size are produced; no crystalline carbon modification is attained below this temperature.

Figure 3:
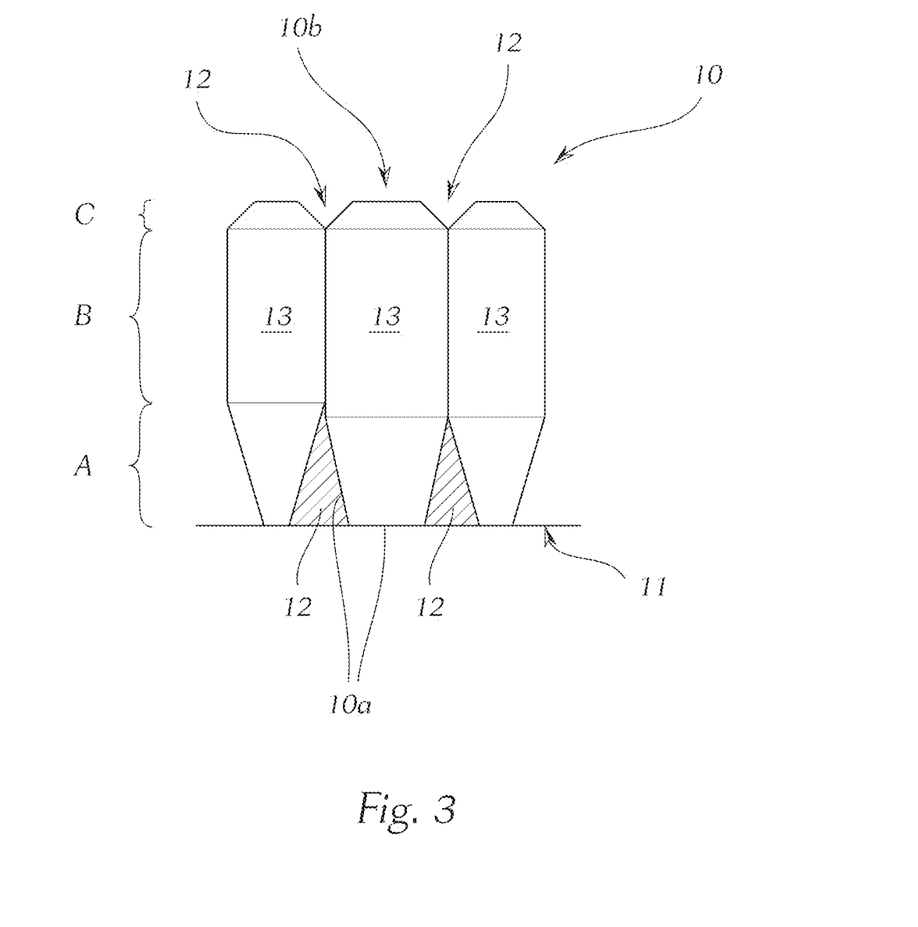
FIG. 3 shows a schematic illustration of a polycrystalline diamond support structure in a section perpendicular to the substrate surface, in which the growth phases of column-shaped diamond crystals can be seen.

FIG. 3 shows a schematic illustration of a polycrystalline diamond support structure 10, in which the growth phases A, B and C of column-shaped diamond crystals 13, 13, 13 on a substrate surface 11 during the course of a CVD deposition process are shown.

Growth phase A: starting with low seed density, there is rapid growth of the crystallites upwardly, i.e. substantially perpendicularly to the substrate surface 11, such that sufficient gaps 12 remain between the individual column-shaped diamond crystals 13, 13, 13 on the inner face 10*a* (i.e. the side facing the substrate surface 11) of the diamond support structure 10.

Growth phase B: once the individual column-shaped diamond crystals 13, 13, 13 have grown together, the layer thickness and thermal mass are produced, alongside a polycrystalline column-shaped diamond texture.

Growth phase C: the formation of preferred facets on the outer face 10*b* of the diamond support structure 10. For example, (111) facets without further subsequent processing would form sufficient gaps 12 for receiving converter material on the outer face 10*b* of the diamond support structure 10.

In certain embodiments the diamond support structure 10 can be processed prior to the application of the converter material by a focussed ion beam (FIB) method, by oxidative etching (for example by applying a metal layer to individual crystal grains and subsequent oxidative etching back of the regions between the metal-coated grains), by polishing, or by stamping (for example with a hot iron tool). In this way, further structures can be introduced into the diamond support structure 10, or structures such as column-shaped diamond crystal tips can be removed.

In order to also be able to apply converter material to the inner face 10*a* of the polycrystalline diamond support structure 10, the diamond support structure 10 and the substrate 11 must be separated from one another. The methods differ depending on the used substrate. In the case of a silicon substrate, the substrate can be removed from the diamond support structure 10 by etching or by being dissolved in an oxidising manner in a hydrofluoric acid-nitric acid mixture. In the case of a molybdenum substrate, the diamond support structure 10 is only weakly bonded and detaches from the molybdenum substrate surface during cooling on account of the different coefficients of thermal expansion.

In order to improve the adhesion of the converter material on the diamond substrate structure 10, an (metal, oxide, carbide, nitride) adhesive layer can additionally be applied to the diamond support structure 10 at least in regions prior to the application of the converter material in order to improve the adhesion of the converter material on the diamond support structure 10.

The converter material can be selected in particular from the group consisting of Cer-doped yttrium aluminium garnet (YAG-Ce), lanthanum-doped yttrium oxide ($Y_2O_3$—$La_2O_3$), magnesium aluminium spinel ($MgAl_2O_4$) and europium-doped $M_2Si_5N_8$ with M=Ca, Sr or Ba.

The converter material can be introduced into the gaps 12 of the diamond support structure 10 and/or applied to the elevations thereof by chemical deposition of gaseous reactants or (physical) material deposition/condensation (for example sputtering or spray-coating). Alternatively, the converter material can be applied to the diamond support structure in a solid, liquid or gel-like preform (for example by being applied using a doctor knife or by means of sol-gel methods) and can be converted in a subsequent reaction (for example by sintering) into a solid phase.

The application of the converter material can additionally be controlled locally by masking/etching of preferably metallic or photopolymer auxiliary layers.

Examples of various converter embodiments will be described further below in conjunction with FIG. 5*a-j*.

Figure 4:
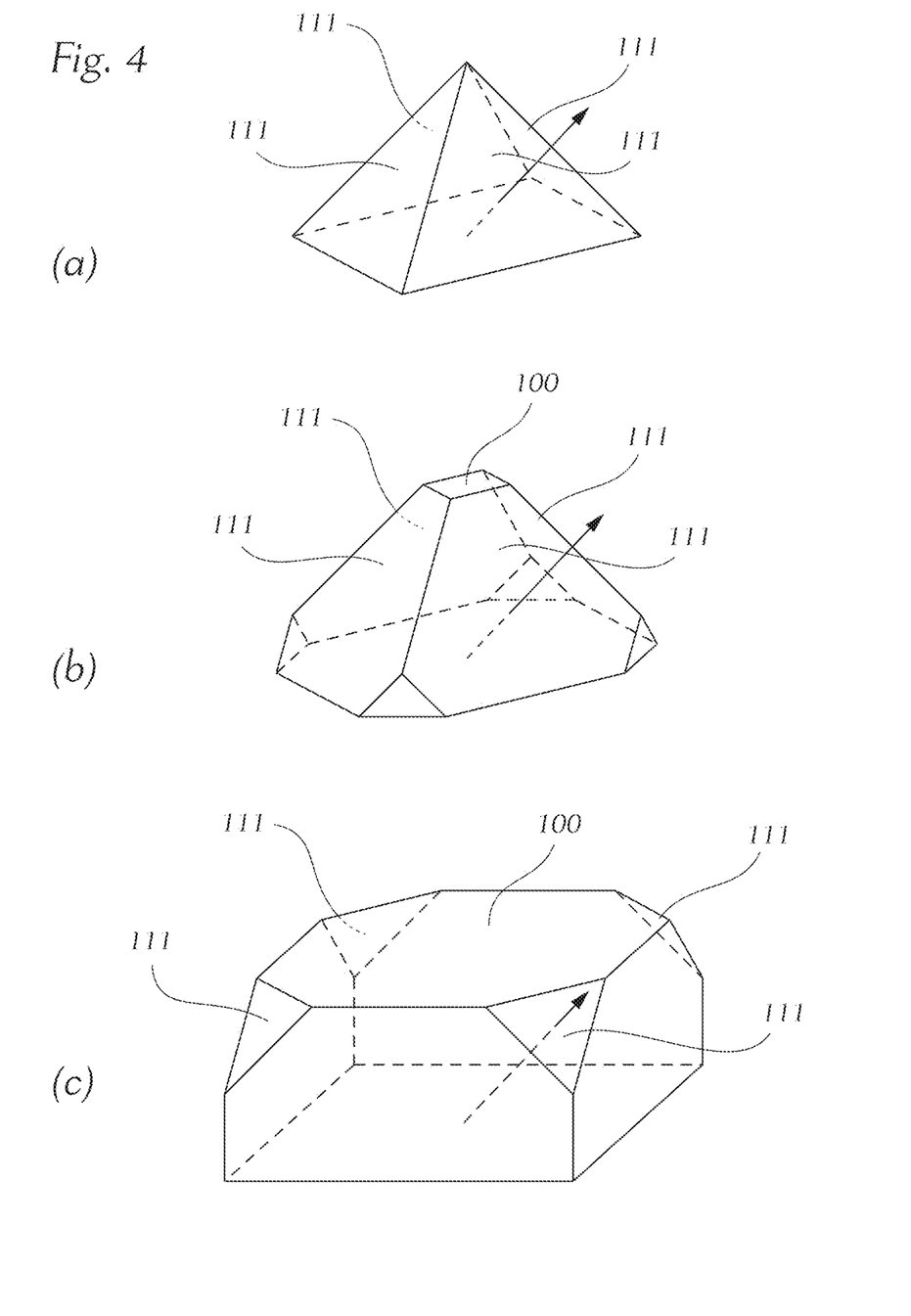
FIG. 4a-f show the relationship between the forming of facets and growth rate in certain directions.

FIG. 4*a-f* show the relationship between the formation of facets and the growth rate of diamond crystals in certain directions. Starting from tetrahedral (111) facets (FIG. 4*a*), a preferred growth (shown by the arrow) in the (111) direction of the surface normals of the tetrahedron faces will be observed. The (111) facets are denoted by 111. Due to the growth in the (111) direction, a (100) facet is first formed (FIG. 4*b*). The (100) facet is denoted by 100. If conditions in which the growth in the (100) direction is slow compared to the (111) direction are selected, the original (111) facets become increasingly smaller, in favour of the (100) facets (FIG. 4*c*).

Conversely, the surface can be terminated selectively by (111) facets. Starting from a surface at which (100) and (111) facets are present in mixed form (FIG. 4*d*), growth conditions that favour growth in the (100) direction (shown by arrows) and that suppress growth in the (111) direction are selected. The (111) facets thus increase their extent, whereas the (100) facets decrease their extent (FIGS. 4*e* and 4*f*). In this way, the facets of the diamond support structure at the surface, i.e. the outer side, can be altered and the topography of the outer side can be shaped. A juxtapositioning of crystallites terminated with surfaces as in FIG. 4*f* produces a topography with deep gaps between the elevations.

Figure 5:
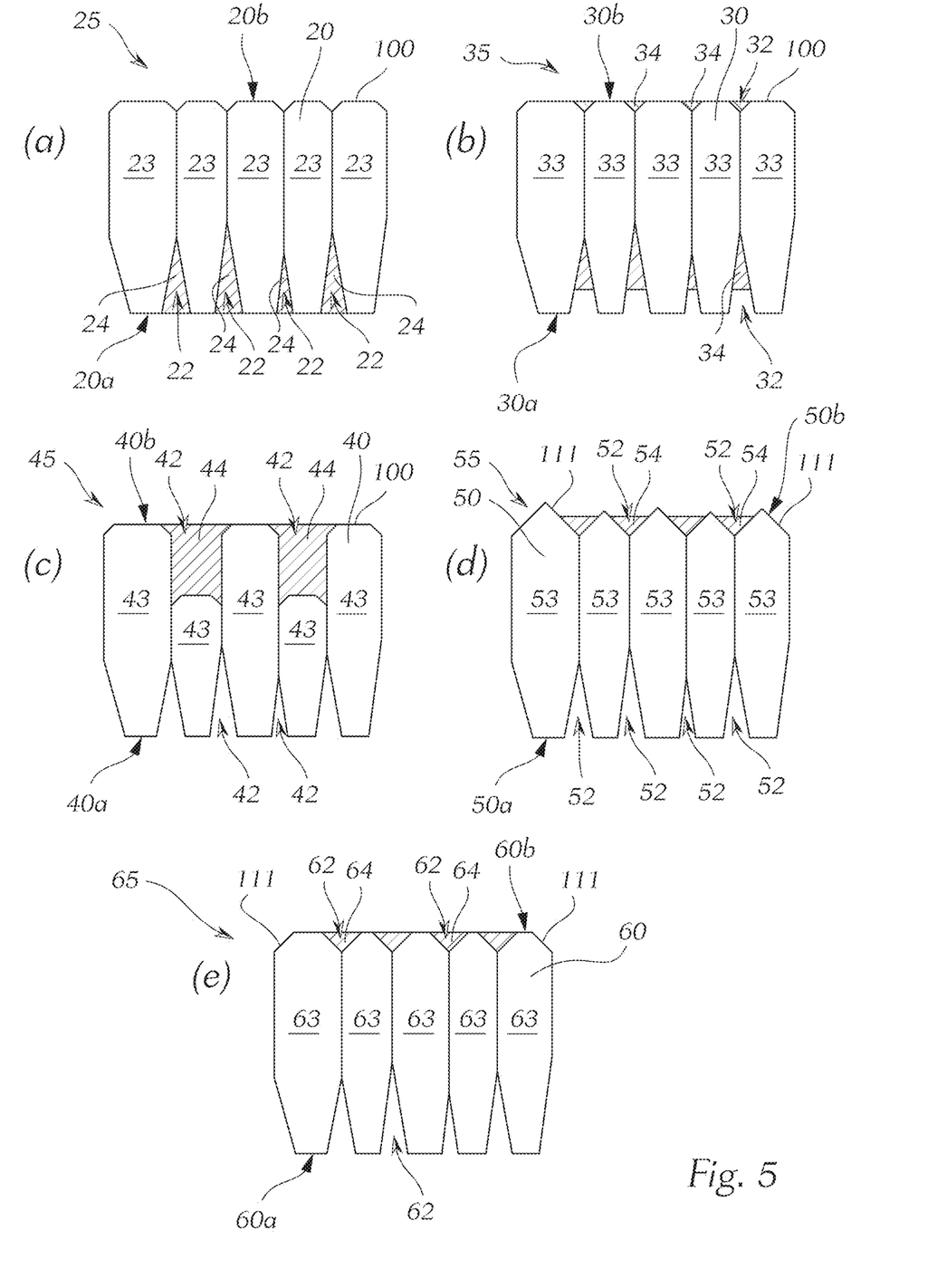
FIG. 5a-j show different embodiments of converters according to the invention.

FIG. 5 *a-j* show various embodiments of converters according to the invention.

FIG. 5*a* shows a converter 25 with a polycrystalline diamond support structure 20 composed of multiple column-shaped diamond crystals 23. The diamond support structure has an inner face 20*a* and an outer face 20*b*, wherein the valley-like gaps 22 on the inner face 20*a* are filled with a converter material 24. The purpose of the converter material 24 is to convert the lights of one wavelength, for example blue laser light, into light of another wavelength or a wavelength mixture, in particular into "white" light. (100) facets are formed on the outer face 20*b* by controlled crystal growth by means of a CVD process.

FIG. 5*b* shows a converter 35 with a polycrystalline diamond support structure 30 composed of multiple column-shaped diamond crystals 33. The diamond support structure 30 corresponds to the diamond support structure 20 from FIG. 5*a*, with the difference that the valley-like gaps 32 of the diamond support structure 30 are (partially) filled on both sides, i.e. both on the inner face 30*a* and on the outer face 30*b*, with converter material 34. (100) facets are formed on the outer face 20*b* by controlled crystal growth by means of a CVD process.

FIG. 5*c* shows a converter 45 with a polycrystalline diamond support structure 40 composed of multiple column-shaped diamond crystals 43. The diamond support structure 40 has an inner face 40*a* and an outer face 40*b* wherein the valley-like gaps 42 are filled on the outer face 40*b* with a converter material 44. The valley-like gaps 42 on the inner face 40*a* are unfilled. The outer face 40*b* of the diamond support structure 40 was further structured by masking and a focussed ion beam (FIB) method, prior to being filled with converter material 44, in order to create larger gaps 42 on the outer face 40*b* for receiving converter material 44. (100) facets are formed on the outer face 40*b* by controlled crystal growth by means of a CVD process.

FIG. 5*d* shows a converter 55 with a polycrystalline diamond support structure 50 composed of multiple column-shaped diamond crystals 53. The diamond support structure 50 has an inner face 50*a* and an outer face 50*h*, wherein the valley-like gaps 52 on the outer face 50*b* are filled with a converter material 54. The gaps 52 on the inner face 50*a* are unfilled. (111) facets are formed on the outer face 50*b* by controlled crystal growth by means of a CVD process, such that the individual column-shaped diamond crystals 53 taper to a point on the outer face 50*b*.

FIG. 5*e* shows a converter 65 with a polycrystalline diamond support structure 60 composed of multiple column-shaped diamond crystals 63. The diamond support structure 60 has an inner face 60*a* and an outer face 60*b*, wherein the valley-like gaps 62 on the outer face 60*b* are filled with a converter material 64. The gaps 62 on the inner face 6 are unfilled. (111) facets are formed on the outer face 60*b* by controlled crystal growth by means of a CVD process, such that the individual column-shaped diamond crystals 63 first taper to a point on the outer face 60*b* (see FIG. 5*d*) and then are capped (for example by etching, polishing, or by means of focussed ion beam (FIP) methods).

FIG. 5*f* and FIG. 5*g* show converters 75 and 85 respectively with a polycrystalline diamond support structure 70 and 80 respectively, composed of multiple column-shaped diamond crystals 73 and 83 respectively. The diamond support structures 70 and 80 respectively have an inner face 70*a* and 80*a* respectively and an outer face 70*b* and 80*b* respectively. (111) facets are formed on the outer faces 70*b* and 80*b* respectively by controlled crystal growth by means of a CVD process, such that the individual column-shaped diamond crystals 73 and 83 respectively form a point on the outer surfaces 70*b* and 80*b* respectively. The outer surfaces 70*b* and 80*b* respectively are covered in a structured manner by converter material 74 and 84 respectively.

In the case of the converter 75 (FIG. 5*f*), the valley-like gaps 72 on the outer face 70*b* are lined with converter material 74. For example, conformal deposition by means of a diffusion-controlled CVD process is used for the lining operation. A (subsequent or concurrent) physical etching process would remove the converter, preferably at the tips of the outer face 70*b*, such that these are free from converter material. A physical etching process is based on removal by ion blasting and results in topographical tips on account of the locally higher stress or higher removal rates.

In the case of the converter 85 (FIG. 5*g*) only the tips 82 on the outer face 80*b* are coated with converter material 84. Here, photolithographic methods are possible, for example. For example, photoresist is applied as auxiliary layer by spin-coating, and the tips are uncovered by being exposed and developed. The converter material is then applied, and then the auxiliary layer and converter material are removed from the valleys between the tips. Here, the lithographic auxiliary layer is removed in a single process step or with utilisation of the increased temperature of a subsequent process.

FIG. 5*h* shows a converter 95 with a polycrystalline diamond support structure 90 composed of multiple column-shaped diamond crystals 93. The diamond support structure 90 has an inner face 90*a* and an outer face 90*b*, wherein the valley-like gaps 92 on the outer face 90*b* are filled with a converter material 94. The gaps 92 on the inner face 90*a* are unfilled. A mixed-facet column texturing comprising both (111) facets and (100) facets is formed on the outer face 90*b* by controlled crystal growth by means of a CVD process.

FIG. 5*i* shows a converter 111 that differs from the converter 95 merely in that the tips of the column-shaped diamond crystals 113 on the outer face 110*b* of the diamond support structure 110 were capped (for example by etching, polishing, or by means of focussed ion beam (FIB) methods) prior to the filling of the gaps 112 with converter material 114. The inner face 110*a* is free from converter material.

It can also be clearly seen from FIG. 5*h* and FIG. 5*i* that larger cohesive converter material regions (pixels) can be produced by means of a mixed-facet column texturing or by capping of the tips.

FIG. 5*j* shows a converter 125 with a diamond support structure 120 corresponding to the diamond support structure 60 from FIG. 5*e*, wherein the converter material 124 is applied to the plateaus 122 of the capped tips of the column-shaped diamond crystals 123 on the outer face 120*b* of the diamond support structure 120. The inner face 120*a* is free from converter material. The converter material 124 for example can be applied to the plateaus as follows: The outer face 120*b* is firstly coated over its entire area with a metal. Tips are then capped by polishing, and the plateaus are thus freed from the metal. The converter material is then deposited over the entire area of the outer face 120*b* in the form of a layer of from 100 to 500 μm by means of a CVD process. By subsequently dissolving the metal, the metal and the converter material are removed in the valleys between the plateaus 122.

As can be clearly seen from FIGS. 5*a*-5*j*, free spaces remain between the regions 22, 32, 42, 52, 62, 72, 82, 92, 112, 122, provided with converter material 24, 34, 44, 54, 64, 74, 84, 94, 114, 124 on the inner and outer faces 20*a*, 20*b*, 30*a*, 30*b*, 40*a*, 40*b*, 50*a*, 50*b*, 60*a*, 60*b*, 70*a*, 70*b*, 80*a*, 80*b*, 90*a*, 90*b*, 100*a*, 110*b*, 120*a*, 120*b* of the respective diamond support structures 20, 30, 40, 50, 60, 70, 80, 90, 110, 120, and said free spaces allow the primary light to pass through the diamond support structures 20, 30, 40, 50, 60, 70, 80, 90, 110, 120 without being converted.

The above-presented examples of converters according to the invention are merely some of many, and therefore are not to be considered as limiting.

The invention claimed is:

1. A converter (25, 35, 45, 55, 65, 75, 85, 95, 115, 125) for a lighting device for a motor vehicle headlight, wherein the converter comprises a converter material (24, 34, 44, 54, 64, 74, 84, 94, 114, 124) for at least partly converting a primary light, which is emitted from a primary light source, into a secondary light, wherein the secondary light has a different wavelength than the primary light, the converter comprising:
a flat diamond support structure (20, 30, 40, 50, 60, 70, 80, 90, 110, 120) made of polycrystalline diamond with a plurality of column-shaped diamond crystals (23, 33, 43, 53, 63, 73, 83, 93, 113, 123), which form a column-shaped diamond texture, wherein regions (22, 32, 42, 52, 62, 72, 82, 92, 112, 122) of the diamond support structure comprise the converter material (24, 34, 44, 54, 64, 74, 84, 94, 114, 124), and free spaces remain between said regions, the free spaces allow the primary light to pass through the diamond support structure without being converted.

2. The converter according to claim 1, wherein the regions (22, 32, 42, 52, 62, 72, 82, 92, 112, 122) of the flat diamond support structure (20, 30, 40, 50, 60, 70, 80, 90, 110, 120) comprising the converter material follow the topography of the flat diamond support structure.

3. The converter according to claim 1, wherein the column-shaped diamond crystals (23, 33, 43, 53, 63, 73, 83, 93, 113, 123) in the flat diamond support structure (20, 30, 40, 50, 60, 70, 80, 90, 110, 120) are oriented substantially in the direction of light propagation.

4. The converter according to claim 1, wherein the diamond support structure (20, 30, 40, 50, 60, 70, 80, 90, 110, 120) is produced by chemical vapour deposition (CVD).

5. The converter according to claim 1, wherein the column-shaped diamond crystals (23, 33, 43, 53, 63, 73, 83, 93, 113, 123) have a mean width of from 1 to 500 μm.

6. The converter according to claim 1, wherein gaps (22, 32, 42, 52, 62, 72, 92, 112) in the diamond support structure (20, 30, 40, 50, 60, 70, 90, 110) are filled at least in part with the converter material (24, 34, 44, 54, 64, 74, 94, 114).

7. The converter according to claim 6, wherein the gaps (22, 32, 42, 52, 62, 72, 92, 112) filled with converter material (24, 34, 44, 54, 64, 74, 94, 114) have a thickness of from 10 μm to 2 mm.

8. The converter according to claim 6, wherein the flat diamond support structure (20, 30, 40, 50, 60, 70, 90, 110) has an inner face (20a, 30a, 40a, 50a, 60a, 70a, 90a, 110a) and an outer face (20b, 30b, 40b, 50b, 60b, 70b, 90b, 110b), wherein gaps on at least one of the faces of the diamond support structure are filled at least in part with converter material (22, 32, 42, 52, 62, 72, 92, 112).

9. The converter according to claim 8, wherein the gaps (22, 32) on the inner face (20a, 30a) of the diamond support structure (20, 30) are filled at least in part with converter material (22, 32).

10. The converter according to claim 8, wherein the gaps on both faces (30a) of the flat diamond support structure (30) are filled at least in part with converter material (32).

11. The converter according to claim 1, wherein the flat diamond support structure (80, 120) has an inner face (80a, 120a) and an outer face (80b, 120b), wherein the converter material (84, 124) is applied at least in part to elevations (82, 122) on at least one of the faces of the diamond support structure.

12. The converter according to claim 11, wherein the converter material (84, 124) is applied at least in part to elevations (82, 122) on the outer face (80b, 120b) of the diamond support structure (80, 120).

13. The converter according to claim 1, wherein the converter material (24, 34, 44, 54, 64, 74, 84, 94, 114, 124) is selected from the group consisting of doped yttrium aluminium garnet (YAG-Ce), lanthanum-doped yttrium oxide ($Y_2O_3$—$La_2O_3$), magnesium aluminium spinel ($MgAl_2O_4$) and europium-doped $M_2Si_5N_8$ with M=Ca, Sr or Ba.

14. A lighting device for a motor vehicle headlight comprising:
a primary light source; and
a converter (25, 35, 45, 55, 65, 75, 85, 95, 115, 125) according to claim 1.

15. The lighting device according to claim 14, wherein the primary light source is a laser light source.

16. A motor vehicle headlight comprising:
a lighting device according to claim 14.

17. A signal light comprising:
a lighting device according to claim 14.

18. A method for producing a converter for a lighting device according to claim 1, the method comprising the following steps:
a) producing a flat polycrystalline diamond support structure on a flat substrate by means of chemical vapour deposition (CVD),
b) at least partially applying converter material in regions of the diamond support structure, wherein free spaces remain between the regions having the converter material, and the free spaces allow the primary light to pass through the diamond support structure without being converted, and
optionally detaching the flat substrate from the polycrystalline diamond support structure after step a) or after step b).

19. The method according to claim 18, wherein the regions having the converter material are selected from the group consisting of gaps and elevations of the diamond support structure.

20. The method according to claim 18, wherein the diamond support structure is processed prior to the application of the converter material by a focussed ion beam (FIB) method, by laser drilling, by oxidative etching, by applying a hot metal powder, by polishing, or by stamping.

21. The method according to claim 18, wherein an adhesive layer is applied to the diamond support structure, at least in regions prior to the application of the converter material, in order to improve the adhesion of the converter material to the diamond support structure.

22. The method according to claim 18, wherein the converter material is applied by chemical deposition of gaseous reactants or by material deposition.

23. The method according to claim 18, wherein the converter material is applied in a solid, liquid or gel-like preform and is then converted into a solid phase connected to the diamond support structure.

24. A method for producing a converter for a lighting device according to of claim 1, the method comprising the following steps:
a) producing a structured converter material layer on a flat substrate,
b) depositing a flat polycrystalline diamond support structure on the substrate having the structured converter material layer by means of chemical vapour deposition (CVD), and
optionally detaching the flat substrate from the polycrystalline diamond support structure having the converter material after step b).

25. The method according to claim 24, wherein the converter material is applied to the substrate by chemical vapour deposition (CVD) in conjunction with photolithographic methods, physical material deposition, such as physical vapour deposition (PVD) in conjunction with photolithographic methods, or by structured printing.

26. The method according to claim 18, wherein the chemical vapour deposition of the diamond support structure is based on a selective seeding of the diamond crystals on the substrate, wherein the substrate or the substrate surface is produced from a foreign material.

27. The method according to claim 26, wherein the substrate is selected from the group consisting of silicon, an element from the group of refractory metals (Ti, Zr, Hf, Va, Nb, Ta, Cr, Mo and W), in particular molybdenum, silicon carbides, carbides of an element from the group of refractory metals (Ti, Zr, Hf, Va, Nb, Ta, Cr, Mo and W), silicon with carbidised surface, and an element from the group of refractory metals (Ti, Zr, Hf, Va, Nb, Ta, Cr, Mo and W) with carbidised surface.

28. The method according to claim 18, wherein the diamond support structure is deposited by chemical vapour deposition on the basis of a homoepitaxial process.

29. The method according to claim 28, wherein the substrate is selected from HPHT diamond or preferably polished natural or CVD diamond substrates.

30. The method according to claim 18, wherein the converter material is selected from the group consisting of Cer-doped YAG (yttrium aluminium garnet, lanthanum-doped yttrium oxide ($Y_2O_3$—$La_2O_3$), magnesium aluminium spinel ($MgAl_2O_4$) and europium-doped $M_2Si_5N_8$ with M=Ca, Sr or Ba.

31. The converter according to claim 5, wherein the column-shaped diamond crystals (23, 33, 43, 53, 63, 73, 83, 93, 113, 123) have a width of from 20 to 100 µm.

32. The converter according to claim 7, wherein the gaps (22, 32, 42, 52, 62, 72, 92, 112) filled with converter material (24, 34, 44, 54, 64, 74, 94, 114) have a thickness of from 100 to 500 µm.

33. The lighting device according to claim 15, wherein the laser light source is configured to emit blue light.

34. The method according to claim 22, wherein the converter material is applied by sputtering or spray-coating.

35. The method according to claim 29, wherein the substrate is a polished natural or CVD diamond substrate.

* * * * *